United States Patent [19]
Deguchi et al.

[11] Patent Number: 5,089,874
[45] Date of Patent: Feb. 18, 1992

[54] SEMICONDUCTOR DEVICE WITH INFRARED MAPPING MARKERS

[75] Inventors: Kazuhide Deguchi; Teruhisa Ohkawa, both of Itami, Japan

[73] Assignee: Mitsubishi Denki Kabushiki Kaisha, Japan

[21] Appl. No.: 581,124

[22] Filed: Sep. 10, 1990

Related U.S. Application Data

[63] Continuation of Ser. No. 448,503, Dec. 11, 1989, abandoned.

[30] Foreign Application Priority Data

Mar. 8, 1989 [JP] Japan .................... 1-56607

[51] Int. Cl.⁵ .................... H01L 27/02; H01L 23/28; H01L 23/42
[52] U.S. Cl. .................... 357/40; 357/72; 356/401
[58] Field of Search .................... 356/51, 401; 357/40, 357/72

[56] References Cited

U.S. PATENT DOCUMENTS

| | | | |
|---|---|---|---|
| 4,211,489 | 7/1980 | Kleinecht et al. | 356/400 |
| 4,481,526 | 11/1984 | Miyasaka | 357/84 |
| 4,523,371 | 6/1985 | Wakashima | 29/588 |
| 4,757,207 | 7/1988 | Chappelow et al. | 250/491.1 |
| 4,824,254 | 4/1989 | Ohtsuka et al. | 356/401 |
| 4,890,245 | 12/1989 | Yomomoto et al. | 364/557 |

FOREIGN PATENT DOCUMENTS

| | | | |
|---|---|---|---|
| 0066835 | 12/1982 | European Pat. Off. | |
| 61-042931 | 3/1986 | Japan | 437/8 |
| 1-090527 | 4/1989 | Japan | 356/401 |
| 86/06176 | 10/1986 | PCT Int'l Appl. | |

OTHER PUBLICATIONS

Lange's Handbook of Chemistry, pp. 20, 21 & 29 of Sect. 8, 1985.
Perry's Chemical Engineer's Handbook, pp. 51–56, of Sect. 10, 1984.
Mead et al., Intro. to VLSI Systems, pp. 97–98, 125–132, 140–143.
Computherm Manual, from Barnes Engr. Div., 1980.
"Operator's Manual for Computherm II Version 3.2A", Jul. 28, 1988, EDO Corporation, Barnes Engineering Division.

Primary Examiner—Andrew J. James
Assistant Examiner—Stephen D. Meier
Attorney, Agent, or Firm—Leydig, Voit & Mayer

[57] ABSTRACT

A semiconductor device includes a semiconductor chip on which a semiconductor element is disposed, the material of the surface emitting a quantity of radiation at a first predetermined temperature, and markers which identify a plurality of points on the surface region, disposed on the surface and formed of a second material which emits a second quantity of radiation, different from the first quantity at the predetermined temperature.

2 Claims, 6 Drawing Sheets

SEMICONDUCTOR DEVICE WITH INFRARED MAPPING MARKERS

This application is a continuation of Application Ser. No. 07/448,503, field Dec. 11, 1989 now abandoned.

FIELD OF THE INVENTION

The present invention relates to a semiconductor device and, more particularly, to a semi-conductor device for simple and rapid measurement of surface temperature with a scanning type radiation thermometer.

BACKGROUND OF THE INVENTION

Conventionally, the surface temperature distribution during operation of a semiconductor device, especially a high power semiconductor device is measured by a scanning type radiation thermometer. For example, during an accelerated temperature test, an infrared ray scanning type surface thermometer (thermoviewer) which measures the quantity of infrared ray emitted from the surface by scanning the same is used for measuring the temperature distribution at the surface of the semiconductor device. An example of a thermoviewer is the "Computerm" produced by Barnes Engineering Division of EDO Corporation, 88 Long Hill Cross Roads, P.O. Box 867, Shelton, CT, 06484, U.S.A.. The construction of this device is shown in FIG. 6. The method of measuring temperature distribution with this apparatus is described below.

First of all, the surface of a sample semiconductor device 200 on an electronic heating/cooling stage 100 is divided into a plurality of two dimensional areas along X-Y coordinates. A scanning head 300 reads data for the respective areas of the partitioned surface. Furthermore, a memory 410 having addresses corresponding to the respective areas of the partitioned surfaces is prepared in the computer 400. This memory 410 includes an emissivity data memory, an emission data memory, and a calculated temperature data memory.

At the establishment of the initial data, emissivity is calculated based on the emission from the sample 200 at two different temperatures (such as 40° C. and 60° C.,) and obtained data are stored in the emissivity data memory. The emission from the sample 200 which is heated up to an established temperature for the acceleration test is measured and the obtained data is stored in the emission quantity data memory. After the establishment of the initial data, the sample 200 heated up to the established temperature of the accelerated test and operated. The emission from the sample 200 in that state is measured and its data is stored at the emission data memory. The computer 400 calculates the temperature for each of the respective partitioned areas of the surface of the sample 200 on the basis of the data stored at the emissivity data memory and emission data memory, and obtained data are stored in the calculated temperature data memory. The temperature distribution is displayed or output on a color monitor 600 or a printer 500 on the basis of the stored data. A cursor 610 is displayed on the screen of the color monitor 600. The instructions for instructing the above described processing are input from the keyboard 700.

As disclosed in the manual "OPERATOR'S MANUAL FOR COMPUTERM" of the above described "Computerm", the initial data are established for each time the sample 200 is fixed on the stage 100 during measurement of the sample 200. Furthermore, the initial data are established each time the sample 200 is moved during the measurement. This is because when the fixed position of the sample 200 is shifted, the addresses of the partitioned surface areas are shifted.

Therefore, in a case where the measurement is repeated at the same established temperature accelerated test, it is necessary to measure the initial data each time a new sample 200 is mounted.

In the prior art semiconductor device of such construction, when the temperature distribution of the surface is to be measured, the initial data has to be established each time a new sample 200 is mounted on the stage 100. Furthermore, even when the sample 200 is shifted from the initial position during a measurement, the initial data has to be again established. This has resulted in a lengthy measurement time.

SUMMARY OF THE INVENTION

It is an object of the present invention to provide a semiconductor device shortening the time for measuring the temperature distribution at the surface of a semiconductor device by an infrared scanning type surface thermometer.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a semiconductor device of the present invention, there are provided a semiconductor chip on which a semiconductor element, having a surface comprising a first material, which emits a first quantity of radiation at a predetermined temperature and markers disposed on the surface identifying a plurality of predetermined positions on the surface, and a second material, which emits a second quantity of radiation at the predetermined temperature. Thus, positional alignments of samples can be made while repeatedly measuring of the temperature distribution of the same kind of samples.

DETAILED DESCRIPTION OF THE PREFERRED EMBODIMENTS

An embodiment of the present invention will be described in detail with reference to the drawings.

Figure 1:
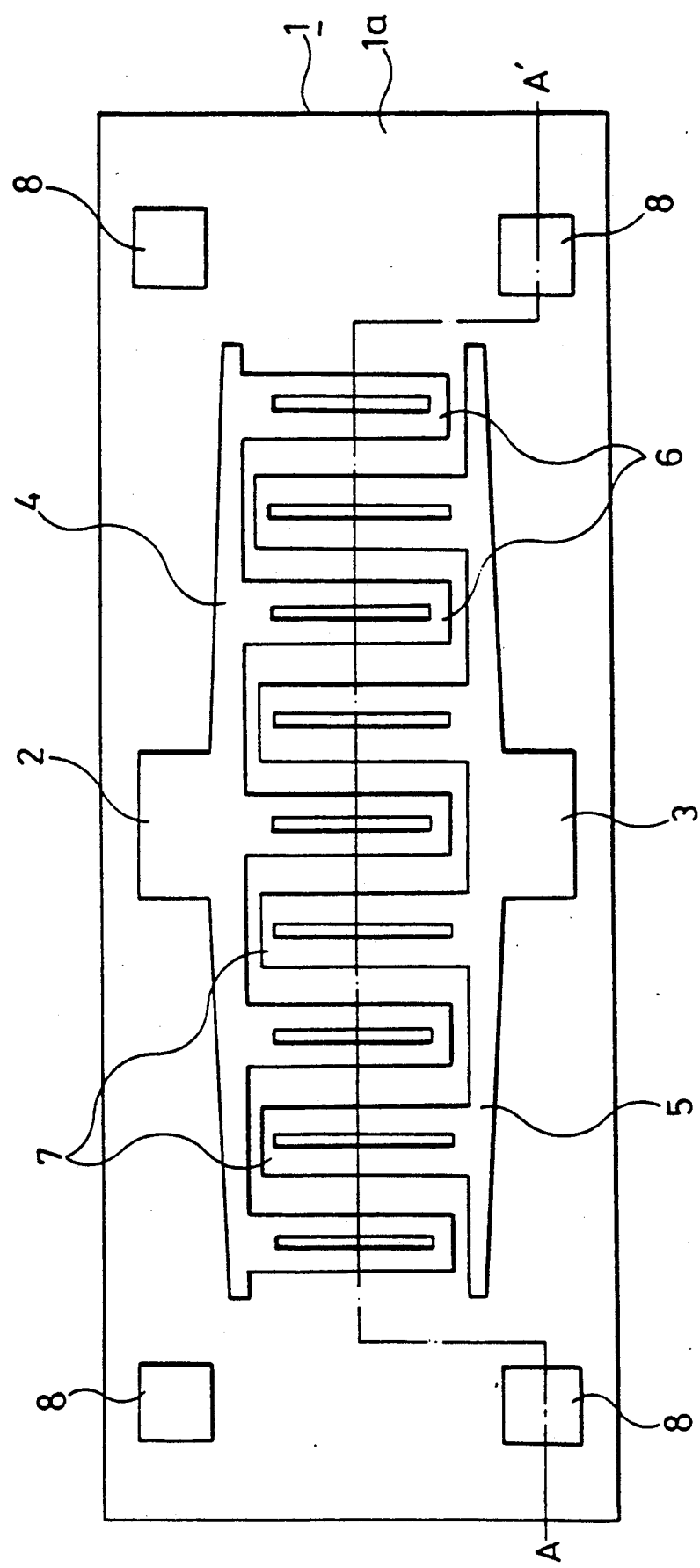
FIG. 1 is a plan view showing a semiconductor device according to a first embodiment of the present invention.
Figure 2:
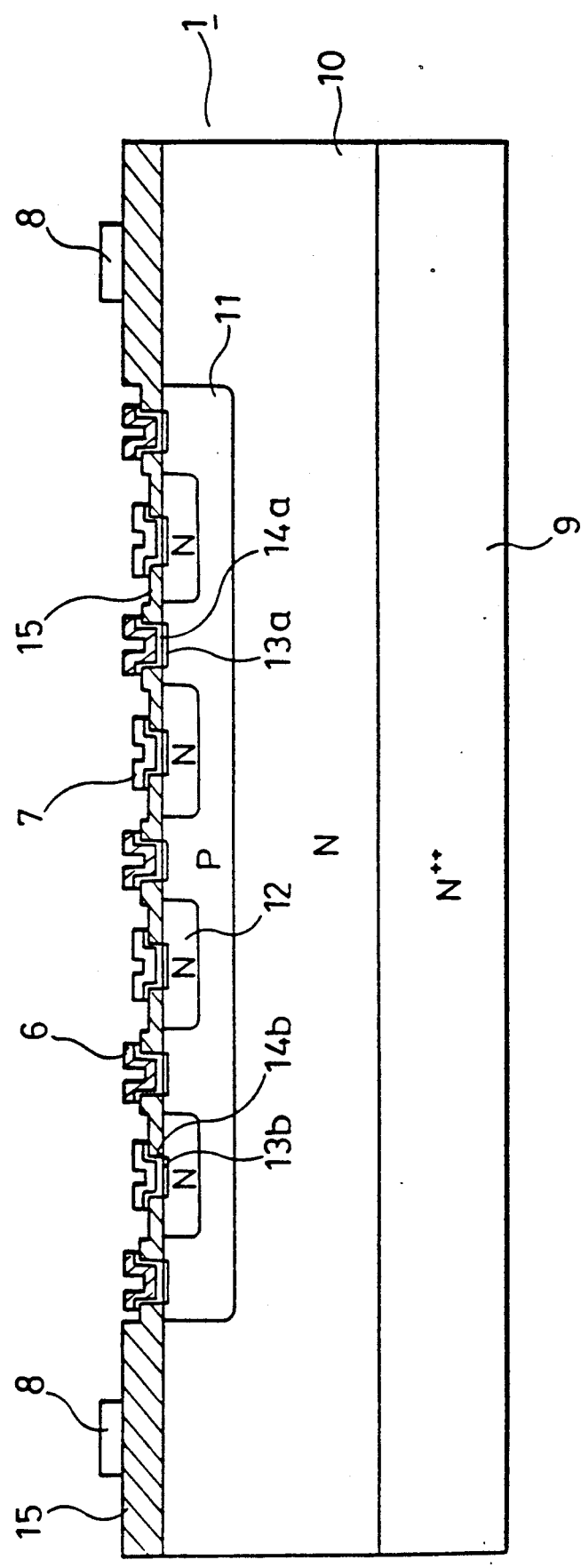
FIG. 2 is a cross-sectional view taken along line A-A showing a of FIG. 1.

FIG. 1 is a plan view showing a transistor chip 1 as a first embodiment of the present invention and FIG. 2 is a cross-sectional view showing the chip 1 taken along line A to A' of FIG. 1.

In FIG. 1, on the surface 1a of the chip 1, a base bonding pad 2 and an emitter bonding pad 3 are disposed opposite each other for connection with external circuits. Furthermore, a base electrode 4 extends from the base bonding pad 2 and an emitter electrode 5 extends from the emitter bonding pad 3 in opposite directions. Base finger regions 6 extend from the base electrode 4 and emitter finger regions 7 extend from the emitter electrode 5, respectively, in opposite directions. These regions relative to usual operation are likely to generate heat.

The transistor chip 1 of the present invention includes markers 8, which do not relate to usual operation, at the four corners of the chip surface 1a. These markers 8 are produced of material having an infrared ray emission quantity quite different from that of the other regions of the surface 1a. For example, polyimide or carbon may be used for the markers 8.

In FIG. 2, an n type collector region 10 is disposed on an N++ (high concentration) type silicon substrate 9. A p type base region 11 is disposed in the n type collector region 10, and further n type emitter regions 12 are disposed in the p type base region 11 with a predetermined interval therebetween.

The p type base region 11 is electrically connected with the base finger regions 6 which are gold, with a predetermined interval therebetween, via an ohmic contact 13a and barrier metal 14a. Furthermore, the n type emitter regions 12 are electrically connected with the emitter finger regions 7 which are gold, with a predetermined interval therebetween, via an ohmic contact 13b and barrier metal 14b. The base finger regions 6 and emitter finger regions 7 are separated by silicon dioxide films 15. Furthermore, the markers 8 are disposed on the silicon dioxide film 15. These markers 8 can be produced simply and precisely by plating the entire surface and thereafter selectively removing unneeded portions using a photolithography technique.

The method of measuring the temperature distribution at the surface of the semiconductor device which was briefly described in the prior art will be described in detail in the following.

Figure 3:
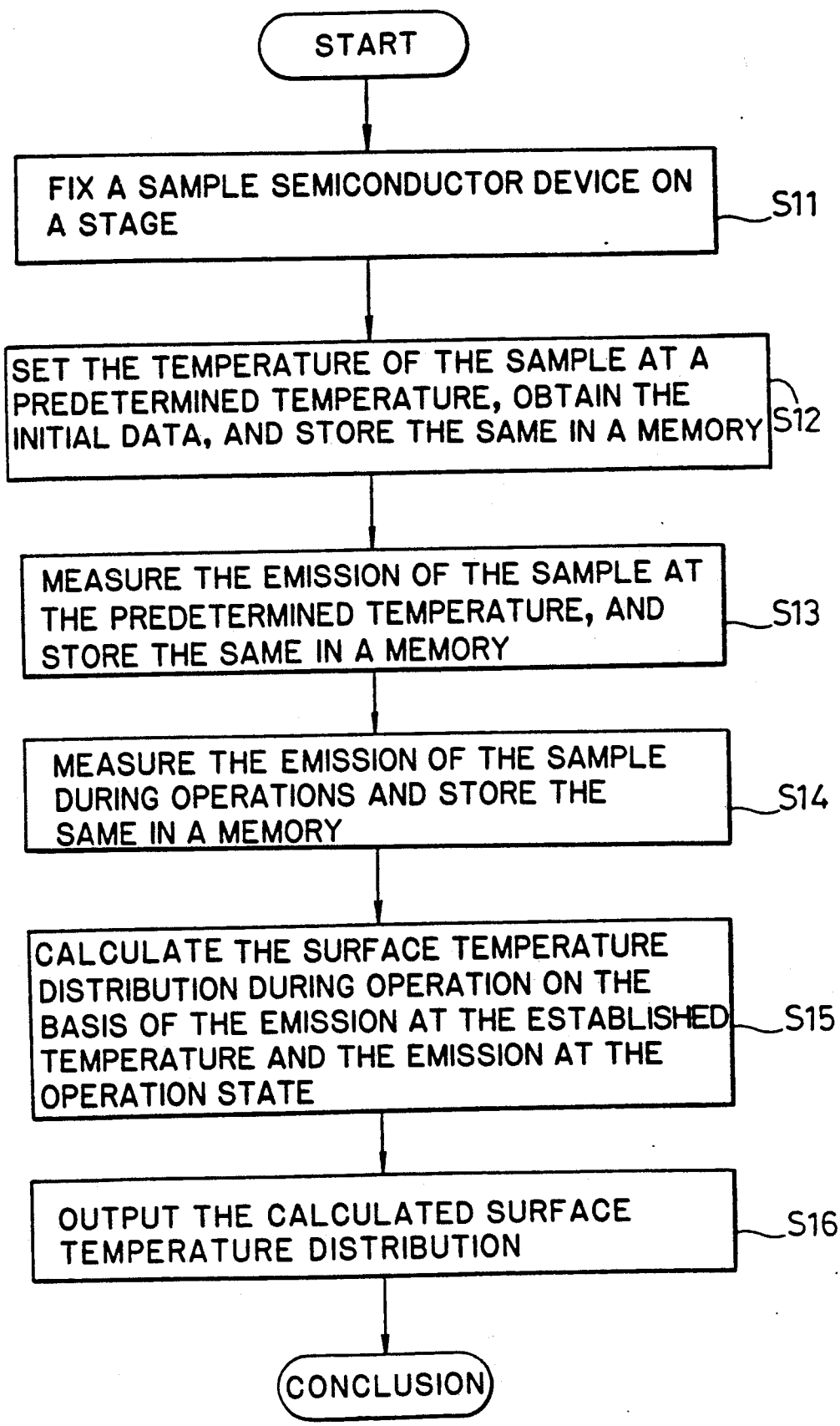
FIG. 3 is a flowchart showing the processing sequence of the measurement of the temperature distribution with the semiconductor device of FIG. 1.
Figure 4:
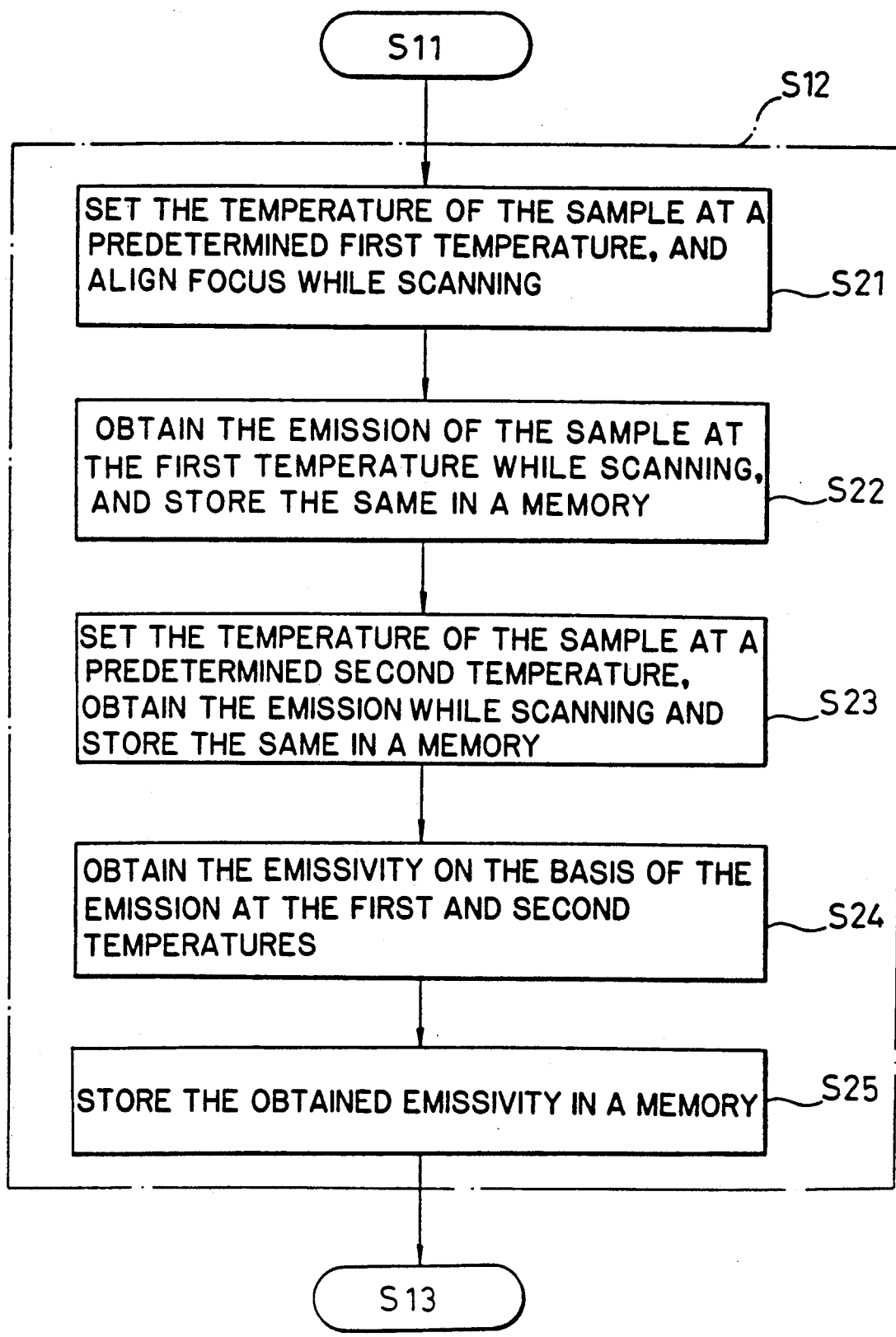
FIG. 4 is a flowchart showing detailed processing of the sequence of FIG. 3.

FIG. 3 shows a flowchart of the process sequence of the measurement and FIG. 4 shows a flowchart of a portion of a processing sequence for establishing initial data at step S12 of FIG. 3.

At first, at step S11 of FIG. 3, a package or sealing material enclosing the semiconductor device is removed to expose the surface of the semiconductor device as a sample 200 and the sample 200 is fixed onto the stage 100. When other peripheral circuits are required for operation of the sample 200, those peripheral circuits are fixed onto the stage 100 together with the sample 200. The stage 100 comprises an electronic heating/cooling (thermoelectric : hereinafter referred to as "TE") stage and the temperature of the stage 100 is established at an arbitrary value.

At step S12, the temperature of the sample 200 is established at a predetermined temperature with using the TE mechanism of the stage 100 and initial data is obtained in that state. First of all, at step S21 of FIG. 4, the temperature of the sample 200 is established at a predetermined first temperature, such as 40° C., and a small quantity of infrared light is emitted from the sample 200. While scanning with the scanning head 300, the focus of the scanning head 300 is against the emitted infrared ray is conducted.

At step S22, the emission of infrared rays from the respective partitioned areas of the sample 200 at the first temperature is measured by scanning. These emission data are stored in the first emission quantity data memory in the memory 410 of the computer 400.

At step S23, the temperature of the sample 200 is established at a second predetermined temperature, such as 60° C., and similarly as at step S22, the emission of infrared rays at the respective partitioned surfaces are measured by scanning. These emission data are stored in the second emission quantity data memory in the memory 410 of the computer 400. Herein, the difference between the first temperature and the second temperature is desired to be greater than 15° C.

At the next step S24, the emissivities of the respective partitioned areas are determined from the infrared radiation quantities measured at the first and second temperatures obtained in steps S22 and S23. From the emission quantity $N_{M1}$ and the black body radiation $N_{T1}$ at the first temperature T1 and the emission quantity $N_{M2}$ and the black body radiation $N_{T2}$ at the second temperature T2, the emissivity (e) is calculated from the following formula, $$e = (N_{M1} - N_{M2}) / (N_{T1} - N_{T2}) \tag{1}$$

The emission quantities $N_{M1}$ and $N_{M2}$ are obtained at the steps S22 and S23 and they are read out from the first and second emission data memory. Furthermore, the black body radiation $N_{T1}$ and $N_{T2}$ corresponding to the temperatures T1 and T2 are previously obtained and are stored in a look-up table.

At step S25, the emissivity (e) thus obtained is stored in a memory as part of the initial data.

At step S13 of FIG. 3, the temperature of the sample 200 is established for an accelerated tested using the TE mechanism. Furthermore, the emission quantities $N_{MS}$ of the respective partitioned surfaces are measured by scanning with the head 300 and are stored in a memory together with the established temperature of the accelerated test.

At step S14, the sample 200 is operated with a current flowing therethrough, and the emission quantities $N_{MR}$ of the respective partitioned surfaces are measured by scanning with the head 300 and are stored in a memory.

At step S15, on the basis of the emissivity (e), emission quantity $N_{MS}$, and emission quantity $N_{MR}$ stored in the memories, the surface temperature distribution of the sample 200 during operation is calculated. This calculation uses the following formula (2).

$$N_{TR} = (N_{MR} - N_{MS}) / e + N_{TS} \tag{2}$$

In the calculation in accordance with the formula (2), the black body radiation $N_{TS}$ corresponding to the established temperature of the accelerated test is previously obtained and is stored at a look-up table memory. By replacing the emissivity (e) of the respective partitioned areas read out from the memory and emission quantities $N_{MS}$ and $N_{MR}$ together with the black body radiation $N_{TS}$ in the formula (2), the black body radiation $N_{TR}$ at the respective partitioned areas of the sample 200 during operation state are obtained. The thus obtained black body radiation $N_{TR}$ can be converted into a surface temperature utilizing a look-up table memory which is previously prepared. From the above described processing, the surface temperature distribution at the operation state is calculated. The temperature distribution thus calculated is stored in a memory.

Furthermore, at step S16, the surface temperature distribution data thus calculated are output. For example, the surface temperature distribution of the sample 200 is visually displayed by printing out by the printer 500 or by multi-color imaging by the color monitor 600.

Figure 5:
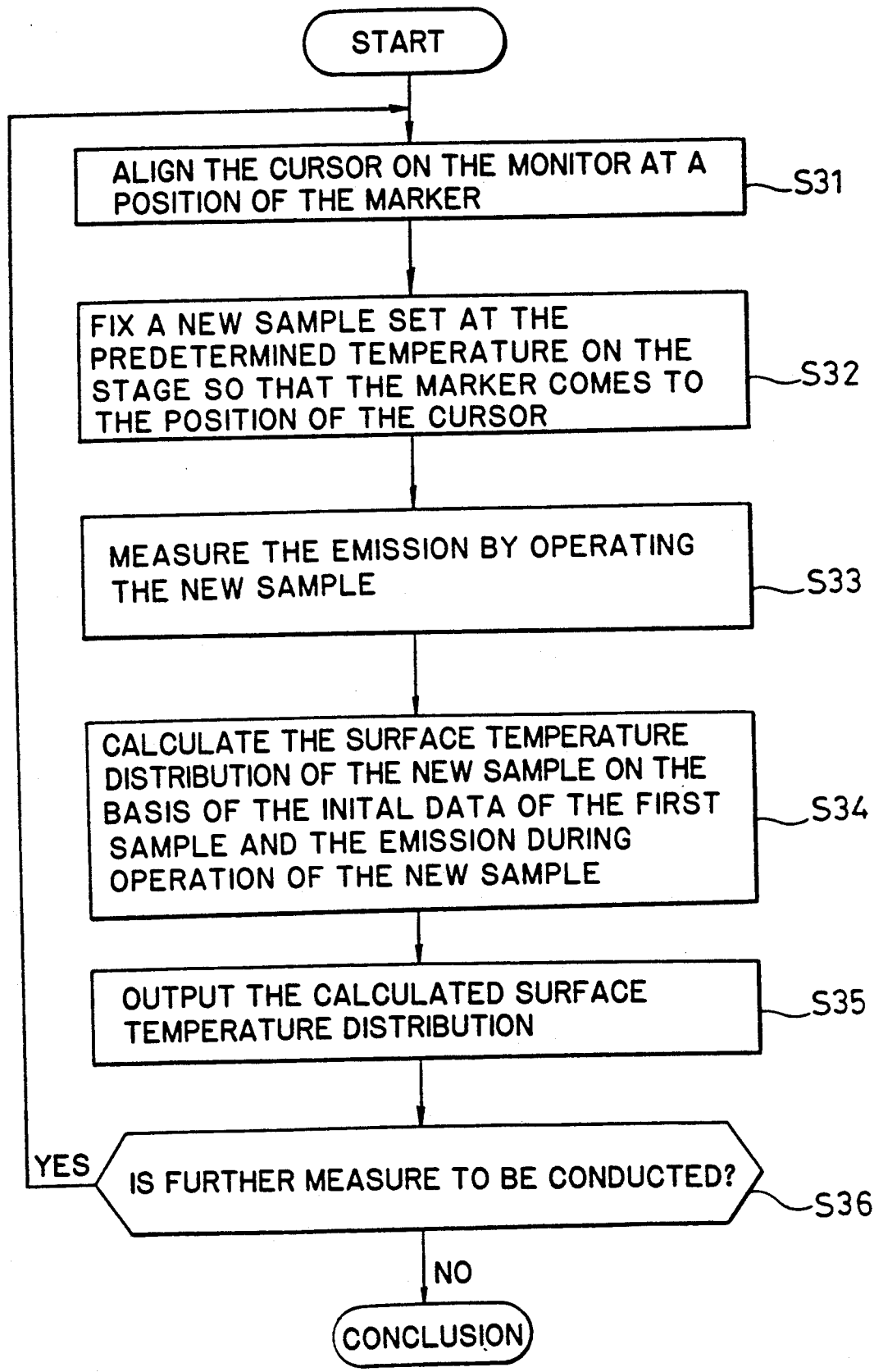
FIG. 5 is a flowchart showing a processing sequence of the measurement of the temperature distribution for a new sample.
Figure 6:
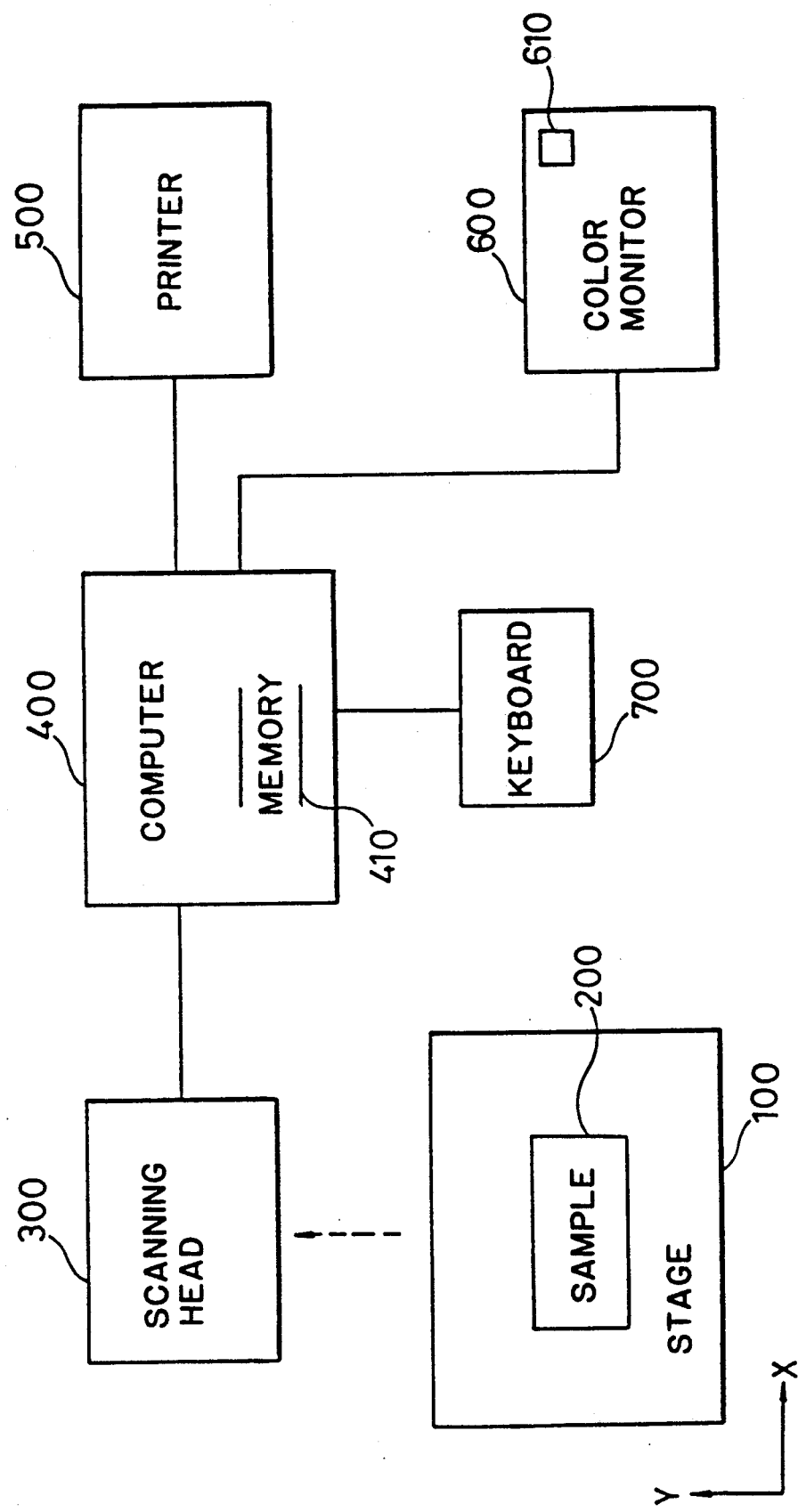
FIG. 6 is a block diagram showing a construction of a prior art thermoviewer.

FIG. 5 shows a flowchart of a process where measurements are made on the same kind of samples 200. When the initial measurement is concluded, the first sample 200 in a non-operating state is established at a predetermined temperature at step S31. As this predetermined temperature is selected to provide a large difference in the infrared emission between the marker 8 and the other region of the surface 1a. This predetermined temperature may be the established temperature of the accelerated test. In this state, the emissions of the respective partitioned surface areas of the first sample 200 are obtained and displayed on the monitor 600. Because the markers 8 have large differences in the emission from the other surface region 1a, their positions can be easily recognized on the monitor 600. Then, a plurality of, such as two, cursors 610 are placed between the two markers 8 on the monitor 600. For confirmation, the temperature and the emission quantity of the markers 8 may be stored in a memory.

Herein, the cursors 610 are placed on the markers 8 at the previously described step S13, and the positions are previously stored at the computer 400. At this step S31, the positions may be read out and displayed on the monitor 600 as positions of the cursors 610.

At step S32, the next sample 200' is fixed on the stage 100. First of all, the next sample 200' is provisionally arranged on the stage 100 and it is established at a predetermined temperature by the TE mechanism. The emission of the respective partitioned surface areas of the next sample 200' are calculated at this state and displayed on the monitor 600. Thus, the positions of the markers 8 of the next sample 200' are confirmed on the monitor 600. Then, at step S31, the position of the next sample 200' determined on the stage 100 by moving the sample 200; for example, by manually, so that the center of the markers 8 of the sample 200' are aligned with a plurality of cursors 610 indicating the positions of the markers 8 of the first sample 200 which are displayed on the monitor 600 at the step S31. Then, the temperature and the emission of the marker 8 obtained at the step S31 may be read out thereby to confirm that the temperature and the emission quantity have approximately the same values. Thus, a new sample 200' is fixed at the same position as the prior sample 200. Furthermore, the focus is aligned at this position.

At step S33, the new sample 200' is operated, and the radiation quantities $N_{MR}$ at the respective partitioned surface areas are measured. This processing is the same as that shown at step S14 of FIG. 3.

At step S34, the surface temperature distribution at the respective partitioned surface areas of the new sample 200' during its operation are calculated on the basis of the initial data concerning the first sample 200, that is, on the basis of the emissivity (e) of the first sample 200 obtained at the step S12 of FIG. 3 and emission $N_{Ms}$ when the first sample 200 is not operating obtained at step S13 of FIG. 3, and the emission quantity $N_{MR}$ during operation of new sample 200' obtained at the step S33. This calculation is carried out using the formula (2) similarly as at step S15 of FIG. 3. The calculated surface temperature distribution data are stored in a memory.

Because the pattern and material are the same for the same kinds of samples 200 and 200', the emission properties at the positions corresponding to each other are approximately the same. Therefore, if positional alignment is achieved with the markers 8, the positions of the respective partitioned surface areas of the old and new samples 200 and 200', that is, the memory addresses thereof, coincide with each other, and therefore, the initial data concerning the old sample 200 can be adopted in the new sample 200'. Thus, the establishment of the initial data can be commonly made through the same kind of samples 200 and 200'.

At the next step S35, similarly as the step S16 of FIG. 3, the calculated surface temperature distribution data are output on the printer 500 or the monitor 600.

At step S36, it is determined whether a further measurement is to be conducted or not for a further new sample 200''. When a further measurement is not to be made, the processing is concluded, and when a further measurement is to be made, the processing step returns to step S31. For this further new sample 200'', the initial data obtained by the measurement of the first sample 200 is applied.

Instead of physically aligning the new and old samples 200 and 200' using the markers 8 as references, positional alignment may be conducted simply with data with using the markers 8 as references. For example, the cursors 610 are aligned on the markers 8 of the first sample 200 on the monitor 600, and the positions thereof are read out as first positions and stored in the computer 400. Next, the cursors 610 are aligned with the markers 8 on the new sample 200' which are fixed at arbitrary positions on the monitor 600, and the position thereof are put into the computer 400 as second positions. Then, the address may be modified by the computer 400 on the basis of the deviation between the first position and the second position so that the both are read out for the same partitioned surface areas when the initial data concerning the first sample 200 and the emission data $N_{MR}$ during the operation of the next sample 200' are read out from the memory.

Furthermore, the markers 8 may be produced in arbitrary configurations and in an arbitrary number to specify a plurality of different points on the surface 1a of the transistor chip 1.

As is evident from the foregoing description, according to the present invention, the markers are produced on a surface region of a semiconductor chip comprising a second material which emits a second quantity of radiation at a predetermined temperature to identify a plurality of predetermined points on the surface region. Therefore, while repeatedly measuring temperature distributions of the same kind of samples, it is possible to align samples by using these markers. As a result, when a plurality of samples are to be measured, the initial data can be commonly used for all samples, and a semiconductor device temperature distribution measurement can be obtained in a shorter time.

What is claimed is:
1. A semiconductor device comprising:
a semiconductor chip having a surface of a semiconductor material partially occupied by at least one semiconductor device, the semiconductor material emitting a first quantity of infrared radiation at a predetermined temperature; and infrared mapping markers disposed at respective locations on portions of the surface not occupied by a semiconductor device for thermally identifying the respective locations on the surface, said markers comprising a material selected from the group consisting of polyimide and carbon and emitting a second quantity of infrared radiation, different from the first quantity of infrared radiation, at the predetermined temperature.

2. A semiconductor device as defined in claim 1 wherein said semiconductor material is silicon.

* * * * *